United States Patent
Hertes

(10) Patent No.: US 9,182,430 B2
(45) Date of Patent: Nov. 10, 2015

(54) DEVICE AND METHOD FOR MEASURING A VALUE OF A RESISTOR

(71) Applicant: CONTINENTAL AUTOMOTIVE GMBH, Hannover (DE)

(72) Inventor: Volker Hertes, Hagelstadt (DE)

(73) Assignee: Continental Automotive GmbH, Hannover (DE)

( * ) Notice: Subject to any disclaimer, the term of this patent is extended or adjusted under 35 U.S.C. 154(b) by 348 days.

(21) Appl. No.: 13/849,101

(22) Filed: Mar. 22, 2013

(65) Prior Publication Data

US 2013/0249575 A1 Sep. 26, 2013

(30) Foreign Application Priority Data

Mar. 22, 2012 (DE) .................. 10 2012 204 569

(51) Int. Cl.
  *G01R 27/08* (2006.01)
  *G01R 27/02* (2006.01)
  *G01K 7/20* (2006.01)
  *G01R 27/14* (2006.01)

(52) U.S. Cl.
  CPC .............. *G01R 27/02* (2013.01); *G01K 7/203* (2013.01); *G01R 27/14* (2013.01)

(58) Field of Classification Search
  CPC .................................................. G01R 27/08
  USPC ........................................ 324/691–713, 525
  See application file for complete search history.

(56) References Cited

U.S. PATENT DOCUMENTS

| | | | | |
|---|---|---|---|---|
| 3,254,299 A | * | 5/1966 | Butler, Jr. | 324/705 |
| 3,491,293 A | * | 1/1970 | Seaborn, Jr. | 324/713 |
| 3,711,770 A | * | 1/1973 | Wilson | 324/711 |
| 3,753,094 A | * | 8/1973 | Furuishi et al. | 324/430 |
| 3,849,725 A | * | 11/1974 | Mori | 324/705 |
| 4,217,543 A | * | 8/1980 | Strong | 324/710 |
| 4,814,692 A | * | 3/1989 | Baumann | 324/607 |
| 4,841,458 A | * | 6/1989 | Levine et al. | 702/133 |
| 4,929,886 A | * | 5/1990 | Toshiyuki | 324/691 |
| 5,500,834 A | * | 3/1996 | Sakaki et al. | 368/9 |
| 5,546,010 A | * | 8/1996 | Verhaart | 324/713 |
| 5,657,238 A | | 8/1997 | Lindeboom | |
| 6,937,028 B2 | * | 8/2005 | Tan | 324/601 |
| 7,071,711 B2 | * | 7/2006 | Bauer et al. | 324/678 |
| 7,126,353 B2 | * | 10/2006 | Pietsch et al. | 324/713 |
| 2003/0030451 A1 | | 2/2003 | Braun | |
| 2003/0090313 A1 | * | 5/2003 | Burgener et al. | 327/408 |

FOREIGN PATENT DOCUMENTS

| | | |
|---|---|---|
| DE | 69511020 T2 | 2/2000 |
| DE | 10119080 A1 | 11/2002 |
| DE | 102004028681 A1 | 1/2006 |

* cited by examiner

*Primary Examiner* — Jermele M Hollington
*Assistant Examiner* — Lamarr Brown
(74) *Attorney, Agent, or Firm* — Laurence A. Greenberg; Werner H. Stemer; Ralph E. Locher

(57) ABSTRACT

A device for measuring the value of a resistor has a first RC element with a first time constant and a second RC element with a second time constant. The first RC element has a first capacitor and a resistor. The second RC element has a second capacitor and the resistor to be measured. An evaluation circuit charges the first and second capacitors to a first and a second voltage, respectively, and initiates their discharge. The evaluation circuit measures the time that elapses from the start of the discharge to the instant at which the voltages across the capacitors are equal, and determines the value of the resistor from the values. In the event that the first time constant is larger than the second time constant, the first voltage is smaller than the second voltage, and vice versa.

1 Claim, 1 Drawing Sheet

DEVICE AND METHOD FOR MEASURING A VALUE OF A RESISTOR

CROSS-REFERENCE TO RELATED APPLICATION

This application claims the priority, under 35 U.S.C. §119, of German patent application DE 10 2012 204 569.4, filed Mar. 22, 2012; the prior application is herewith incorporated by reference in its entirety.

BACKGROUND OF THE INVENTION

Field of the Invention

The value of a resistor often serves as a measure of the temperature, for example of a heating element. Consequently, the resistance needs to be measured in order to determine the temperature. Although in principle this can be accomplished by way of the quotient of the voltage drop across the resistor and the current flowing through the resistor, this is complex and expensive, since a specific shunt resistor is usually required for measuring the current. However, the value of the shunt has an upper limit for reasons of power loss, and the physical size of the shunt limits the value downwards. The current-measuring circuit must be designed in a correspondingly sensitive manner with corresponding concessions in terms of accuracy. Moreover, large resistors tend to exhibit lower reliability for the solder joints. In the case of loads with a fixed ground connection, in which the supply of power is controlled by connecting and disconnecting the battery voltage, the shunt must be on the battery side of the load and the battery-referenced current-measuring signal must be converted in a complex manner into a ground-referenced signal so that it can be processed further.

SUMMARY OF THE INVENTION

It is accordingly an object of the invention to provide a method and a device which overcome a variety of disadvantages of the heretofore-known devices and methods of this general type and which provides for a novel a device and a method for measuring the value of a resistor.

With the foregoing and other objects in view there is provided, in accordance with the invention, a device for measuring a value of a resistor, comprising:

a first RC element having a first time constant, the first RC element including a first capacitor and a further resistor connected in parallel with the first capacitor;

a second RC element having a second time constant, the second RC element including a second capacitor and the resistor to be measured connected in parallel with the second capacitor;

an evaluation circuit connected to the first and second capacitors and being configured:

to charge the first and second capacitors to a first voltage and a second voltage, respectively, and to initiate a discharge thereof through only the further resistor or the resistor to be measured;

to measure a time that elapses from a start of a discharge of the first and second capacitors to an instant at which the voltages across the first and second capacitors are equal; and to determine the value of the resistor to be measured from the values, wherein, in an event that the first time constant is greater than the second time constant, the first voltage is smaller than the second voltage, and vice versa.

In other words, the objects of the invention are achieved by way of a device for measuring the value of a resistor, having a first RC element, which has a first time constant and is formed from a first capacitor and a further resistor, which is connected in parallel with the first capacitor. In addition, the device has a second RC element, which has a second time constant and is correspondingly formed from a second capacitor and the resistor to be measured, which is connected in parallel with the second capacitor. The capacitors are charged to different voltages by means of an evaluation circuit, wherein the first time constant is larger than the second time constant when the first voltage is smaller than the second voltage, and vice versa. If appropriate switching means ensure at a particular instant that the capacitors can only discharge via the resistors assigned thereto, there is a particular instant at which the voltages across the two capacitors are equal. This instant can be detected. The value of the resistor to be measured can be calculated from knowledge of this instant and of the values of the two capacitors and the further resistor, and also of the ratio of the two voltages to which the capacitors are charged.

In accordance with an added feature of the invention, a voltage divider is connected between the first and second capacitors and a voltage source for charging the capacitors, and wherein the evaluation circuit is configured to connect one of the first and second capacitors to the voltage source via a first controllable switch and to connect the respectively other capacitor to the voltage source via the first switch and the voltage divider, and wherein the voltage divider is configured to draw no current while the first and second capacitors are discharging.

In accordance with an advantageous feature of the invention, a first switch connected at an input of the voltage divider and a second switch connected at an output of the voltage divider are driven by the evaluation circuit so as to be open during the discharge process.

With the above and other objects in view there is also provided, in accordance with the invention, a method of measuring a value of a resistor. The method which comprises:

providing a measuring device as outlined above and charging the first capacitor of the first RC element to a first voltage and charging the second capacitor of the second RC element to a second voltage;

if the first time constant is greater than the second time constant, the first voltage is smaller than the second voltage, and vice versa, and a ratio of the first voltage to the second voltage is 1/K;

with an evaluation circuit, initiating a discharge of the capacitors and measuring a time interval that elapses from a start of the discharge of the capacitors to an instant at which the first and second voltages across the capacitors are equal, and determining a value of the resistor to be measured from the values of the first and second capacitors, of the further resistor, the ratio of the first voltage to the second voltage, and the measured time.

In accordance with a concomitant feature of the invention, the evaluation circuit is configured to determine the value of the resistor according to the formula $$R_L = \frac{1}{C_L} \frac{T_0 R_R C_R}{T_0 + R_R C_R \ln K}$$

wherein:
$R_L$ is the value of the resistor to be measured;
$C_L$ is the capacitance of the second capacitor;
$T_0$ is the measured time interval;
$R_R$ a resistance of the first resistor;
$C_R$ is a capacitance of the first capacitor;
K is a ratio of the first voltage to the second voltage.

Other features which are considered as characteristic for the invention are set forth in the appended claims.

Although the invention is illustrated and described herein as embodied in a device and method for measuring the value of a resistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
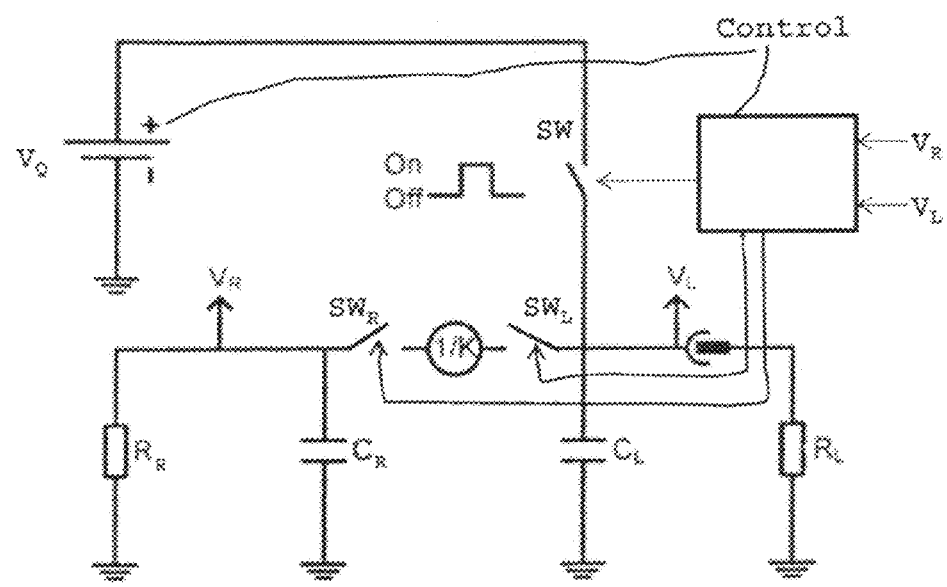
FIG. 1 is a basic circuit illustration of a device according to the invention.

Referring now to the figures of the drawing in detail and first, particularly, to FIG. 1 thereof, a first RC element is formed from a first capacitor $C_R$ and a further resistor $R_R$, which is connected in parallel with the first capacitor $C_R$. A second RC element is formed from a second capacitor $C_L$ and the resistor $R_L$ to be measured. The two capacitors $C_R$, $C_L$ are connected to a voltage source $V_Q$, and are charged to a particular voltage, by operation of a first switch SW1. In this case the value of said voltage is not important, rather only the ratio of the first voltage $V_R$ across the first capacitor $C_R$ to the second voltage $V_L$ across the second capacitor $C_L$. This is indicated by a voltage divider symbol 1/K, which represents a circuit by which the voltage of the voltage source $V_Q$ is divided by the factor K. This can be realized with a simple voltage divider having resistors; however, it can also be of more complex design.

The voltage divider 1/K is configured such that in the event that the capacitors $C_R$, $C_L$ are discharging, no current can flow via the voltage divider 1/K, but rather the capacitors $C_R$, $C_L$ can discharge only via the resistor $R_R$, $R_L$ respectively assigned thereto. As is shown schematically in FIG. 1, this can be accomplished by means of corresponding switches $SW_R$, $SW_L$, which can be controlled by the evaluation circuit Control, at the input and output of the voltage divider 1/K.

Figure 2:
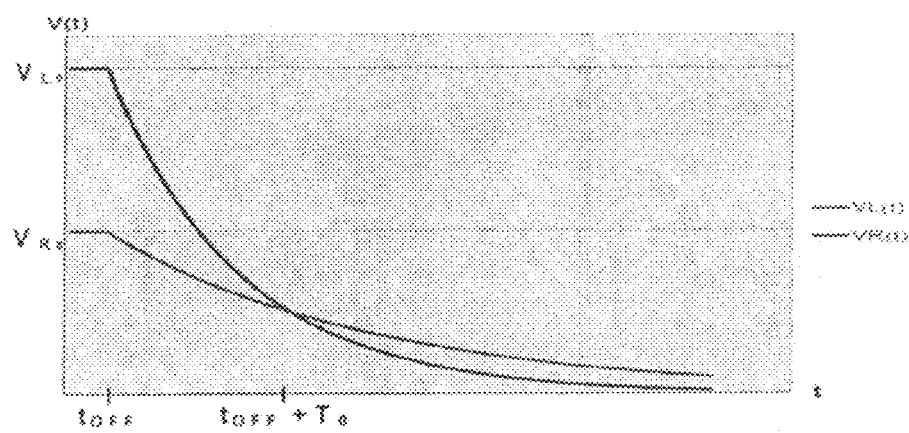
FIG. 2 graph showing the profile of the voltages across the two capacitors.

As can be seen in FIG. 2, at an instant $t_{OFF}$ the switches SW, $SW_R$, $SW_L$ are opened by the evaluation circuit Control, which ensures that the connection between the capacitors $C_R$, $C_L$ and the voltage divider 1/K is also interrupted, with the result that the capacitors can discharge only through the resistors $R_R$, $R_L$ assigned thereto in the two RC elements.

The voltages $V_R$ and $V_L$ across the capacitors are supplied to the evaluation circuit Control and, for example, have a profile as shown in FIG. 2. At the instant $T_0$, after the switch-off operation at the instant $t_{OFF}$, the two voltages $V_R$ and $V_L$ have the same value, and this is detected by the evaluation circuit Control. The evaluation circuit Control has a chronometric device in order to record the time period $T_0$. The value of the resistor $R_L$ can be determined from the known values of the first capacitor $C_R$, of the further resistor $R_R$, of the second capacitor $C_L$, the determined time period $T_0$ and the ratio 1/K of the two voltages $V_R$ and $V_L$ to which the two capacitors were initially charged, according to the formula $$R_L = \frac{1}{C_L} \frac{T_0 R_R C_R}{T_0 + R_R C_R \ln K}.$$

The device according to the invention and the method according to the invention allow indirect current measurement using a complex and expensive amplifier circuit consisting of shunt, operational amplifier and feedback network to be omitted. Likewise, quantitative determination of the voltage across the resistor is not necessary. In this case the measurement result is independent not only of the voltage to be applied by the voltage source $V_Q$ but also of the residual resistances of the closed switches SW, $SW_R$, $SW_C$, which are usually realized by transistors in which the switch-on resistances are highly dependent on temperature and current.

The invention claimed is:

1. A method of measuring a value of a resistor, which comprises:
    providing a first RC element, formed of a first capacitor and a further resistor and having a first time constant, and charging the first capacitor to a first voltage;
    providing a second RC element, formed of a second capacitor and the resistor to be measured and having a second time constant, and charging the second capacitor to a second voltage;
    if the first time constant is greater than the second time constant, the first voltage is smaller than the second voltage, and vice versa, and a ratio of the first voltage to the second voltage is 1/K;
    with an evaluation circuit, initiating a discharge of the capacitors and measuring a time interval that elapses from a start of the discharge of the capacitors to an instant at which the first and second voltages across the capacitors are equal, and determining a value of the resistor to be measured from the values of the first and second capacitors, of said further resistor, the ratio of the first voltage to the second voltage, and the measured time;
    wherein said evaluation circuit is configured to determine the value of the resistor according to the formula $$R_L = \frac{1}{C_L} \frac{T_0 R_R C_R}{T_0 + R_R C_R \ln K}$$

wherein:
$R_L$ is the value of the resistor to be measured;
$C_L$ is the capacitance of the second capacitor;
$T_0$ is the measured time interval;
$R_R$ a resistance of the first resistor;
$C_R$ is a capacitance of the first capacitor;
K is a ratio of the first voltage to the second voltage.

\* \* \* \* \*